United States Patent
Hsu et al.

(10) Patent No.: US 7,435,648 B2
(45) Date of Patent: Oct. 14, 2008

(54) METHODS OF TRENCH AND CONTACT FORMATION IN MEMORY CELLS

(75) Inventors: Miao Chih Hsu, Taichung (TW); Tzung Ting Han, Yilan (TW); Ming Shang Chen, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 156 days.

(21) Appl. No.: 11/459,990

(22) Filed: Jul. 26, 2006

(65) Prior Publication Data

US 2008/0026561 A1    Jan. 31, 2008

(51) Int. Cl.
*H01L 21/336* (2006.01)

(52) U.S. Cl. .................. 438/258; 438/257; 438/593; 438/E21.423; 438/E21.679

(58) Field of Classification Search ......... 438/257–258, 438/593–594, 201; 257/314–315
See application file for complete search history.

(56) References Cited

U.S. PATENT DOCUMENTS

| | | | |
|---|---|---|---|
| 4,721,689 | A | 1/1988 | Chaloux, Jr. |
| 5,434,451 | A | 7/1995 | Dalal |
| 6,096,655 | A | 8/2000 | Lee |
| 6,468,897 | B1 | 10/2002 | Cheng |
| 6,642,139 | B1 | 11/2003 | Chung |
| 6,706,626 | B2 | 3/2004 | Huang |
| 6,790,729 | B1 | 9/2004 | Woo |
| 6,831,335 | B2 | 12/2004 | Huang |
| 6,869,879 | B1 | 3/2005 | Ryan |
| 2004/0130947 | A1* | 7/2004 | Fan et al. ............ 365/185.05 |
| 2006/0214216 | A1* | 9/2006 | Liao et al. .............. 257/315 |

OTHER PUBLICATIONS

Wolf, "15.4 Introduction to Dual-Damascene Interconnect Process", *Silicon Processing for the VLSI Era*, vol. 4, pp. 674-679 (2004). Lattice Press, Sunset Beach, CA.
Crystec Technology Trading GmbH, "CMP Process", www.crystec.com/alpovere.htm, 7 pages (2005).
Crystec Technology Trading GmbH, "Copper anneal in semiconductor manufacturing", www.crystec.com/kllcuae.htm, 4 pages (2005).
"Copper Damascene", www.semitool.com/print/cooperapp.html, 1 page (2005).
"Damascene Metallisation", http://oldeee.see.ed.ac.uk/STR/research_projects/ACME/, The University of Edinburgh, 3 pages (1998).

* cited by examiner

*Primary Examiner*—Dung A. Le
(74) *Attorney, Agent, or Firm*—Jianq Chyun IP Office

(57) ABSTRACT

Methods of contact formation and memory arrays formed using such methods, which methods include providing a memory array having a plurality of bit lines disposed below a surface of a semiconductor substrate and a plurality of word lines disposed above the surface of the substrate and transverse to the bit lines; forming a hard mask material layer over the plurality of word lines, wherein an area above at least one of the bit lines and between two consecutive word lines is exposed below an opening in the hard mask material layer; forming an insulating material layer above the hard mask material layer; forming a contiguous trench and via pattern in the insulating material layer above the area such that a portion of the at least one bit line is exposed below the pattern; and forming an interconnection comprising a conductive material disposed in the contiguous trench and via pattern wherein the interconnection is in conductive contact with the exposed portion of the at least one bit line.

24 Claims, 13 Drawing Sheets

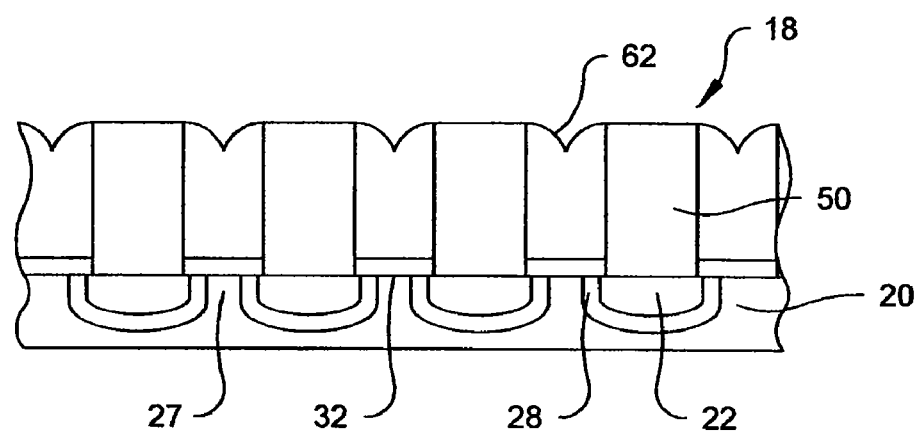
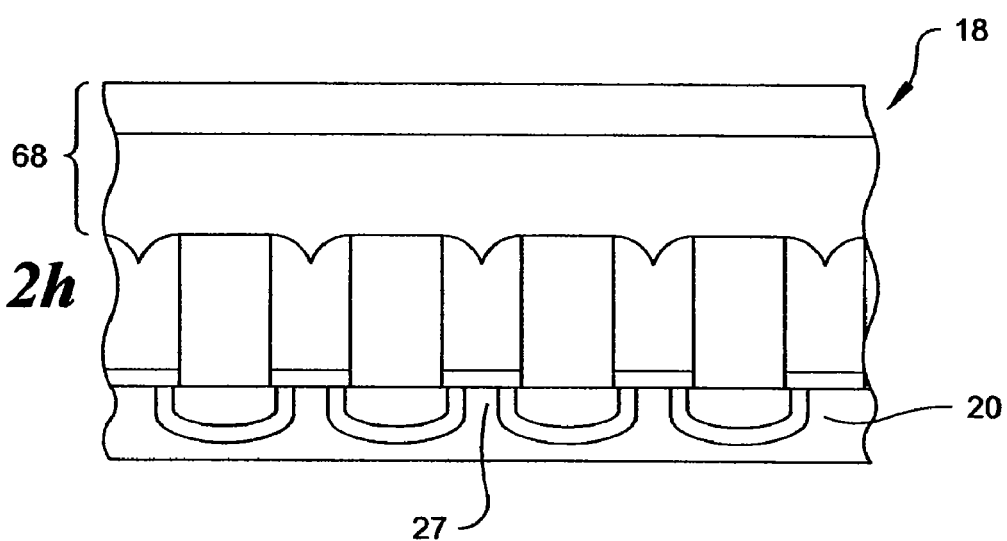
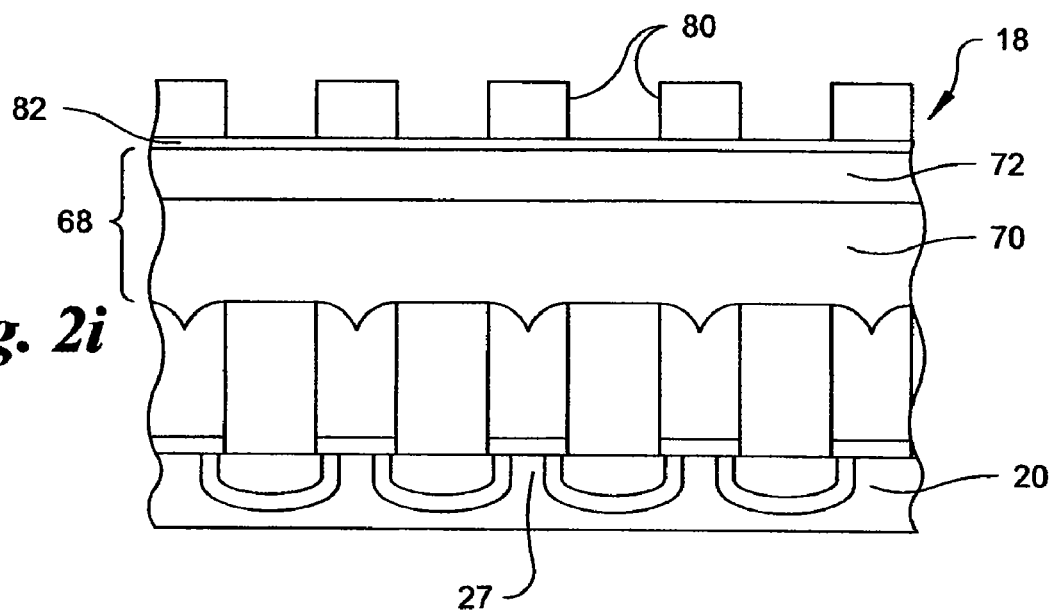

METHODS OF TRENCH AND CONTACT FORMATION IN MEMORY CELLS

BACKGROUND OF THE INVENTION

Integrated circuits are manufactured as assemblies of various devices, such as multiple transistors that can make up a single chip and as multiple chips that can be included on a single wafer. In most processes for manufacturing integrated circuits, after individual devices, such as the transistors, have been fabricated on the silicon substrate, they are connected together to perform desired circuit functions. This connection process is generally referred to as "metallization," and can be carried out using a number of different photolithographic and deposition techniques.

Due to the high level of integration of devices and the large number of circuits on a single chip, interconnections are often no longer made by means of a single level of interconnections. Instead, it can be necessary to provide at least two and sometimes more conductor interconnection levels, with each interconnection level having a pattern of wiring trenches being separated from the others by an insulating layer. Connections between these interconnection pattern levels and the various devices on a chip are then made by means of contact plugs, also referred to as vias, which are formed by etching a via hole through the insulating layers separating the devices and wiring trenches and then filling the via holes and trenches with a metal or other conductive material to connect the individual devices.

In general, the formation of conductive wiring patterns and vias is carried out by a process which includes depositing an insulating layer over an integrated circuit comprising numerous memory devices on a silicon wafer and then forming wiring trenches and via holes in the insulating layer by etching a pattern in the insulating layer to expose various portions of any number of the memory devices in the integrated circuit below, and filling the trenches and via holes with a conductive material. Chemical mechanical polishing is then often used to remove excess conductive material outside the trenches of the pattern formed in the dielectric material.

Various methods are used to form vias and wiring trenches in interlayer insulating materials for multilevel metal interconnection microelectronics. Such methods are known and referred to as damascene processes. It is often advantageous to fill both vias and trenches with a single metallization step. Such processes wherein the metal forming the vias and the metal forming the wiring trenches are deposited simultaneously are referred to as dual-damascene processes. However, even when the vias and trenches are metallized simultaneously, the processes still include two separate etching steps. In other words, the via holes and wiring trenches are separately etched.

The separate etching of the via holes and wiring trenches often leads to difficulty in achieving overlay alignment between the via holes and the trenches. The misalignment problem between trenches and vias in modern damascene processes has become more difficult to avoid with the decreasing minimum feature size necessitated by the increased demands of integration for high density semiconductor devices.

Accordingly, there is a need in the art for a method of forming interconnection systems for integrated circuits which avoids the misalignment or overlay alignment problem of connecting vias and wiring trenches, particularly in interlayer interconnection systems.

BRIEF SUMMARY OF THE INVENTION

The present invention relates, in general, to methods of forming interconnections in various integrated circuits and semiconductor devices, and to memory arrays formed using such methods. More particularly, the present invention includes methods of forming interconnections which can avoid overlay alignment problems which often result from separately etching trenches and via holes.

One embodiment of the present invention includes methods which comprise: providing a memory array comprising a plurality of bit lines disposed below a surface of a semiconductor substrate and a plurality of word lines disposed above the surface of the substrate and transverse to the bit lines; forming a hard mask material layer over the plurality of word lines, wherein an area above at least one of the bit lines and between two consecutive word lines is exposed below an opening in the hard mask material layer; forming an insulating material layer above the hard mask material layer; forming a contiguous trench and via pattern in the insulating material layer above the area such that a portion of the at least one bit line is exposed below the pattern; and forming an interconnection comprising a conductive material disposed in the contiguous trench and via pattern wherein the interconnection is in conductive contact with the exposed portion of the at least one bit line. The present invention also includes memory arrays prepared in accordance with such methods.

Another embodiment of the present invention includes methods which comprise: providing a memory array comprising a plurality of bit lines disposed below a surface of a semiconductor substrate and a plurality of word lines disposed above a surface of the substrate and transverse to the bit lines, wherein at least one of the bit lines is at least partially covered by a dielectric material; forming a hard mask material layer above the plurality of word lines, wherein an area above the dielectric material and between two consecutive word lines is exposed below an opening in the hard mask material layer; forming an insulating material layer above the hard mask material layer; forming a contiguous trench and via pattern in the insulating material layer above the area and in the dielectric material below the area such that a portion of the at least one bit line is exposed below the pattern; and forming an interconnection comprising a conductive material disposed in the contiguous trench and via pattern wherein the interconnection is in conductive contact with the exposed portion of the at least one bit line. The present invention also includes memory arrays prepared in accordance with such methods.

Yet another embodiment of the present invention includes memory arrays which comprise: a plurality of bit lines disposed below a surface of a semiconductor substrate; a plurality of word lines disposed above the surface of the substrate and transverse to the bit lines; a hard mask material disposed over the word lines wherein an area above at least one of the bit lines and between two consecutive word lines is exposed below an opening in the hard mask material; an insulating material layer disposed above the hard mask material; and an interconnection comprising a contiguous conductive material-filled trench and via disposed in a pattern formed in the insulating layer such that the conductive material-filled via extends through the opening in the hard mask material and is in conductive contact with the at least one of the bit lines.

Still another embodiment of the present invention includes memory arrays which comprise: a plurality of bit lines disposed below a surface of a semiconductor substrate; a plurality of word lines disposed above the surface of the substrate and transverse to the bit lines; and a hard mask material layer disposed over the word lines, wherein an area above at least one of the bit lines and between two consecutive word lines is exposed below an opening in the hard mask material layer.

In some embodiments of memory arrays according to the present invention, one or more of the word lines can have an upper surface and sidewalls, wherein the hard mask material layer comprises a hard mask capping layer disposed above the upper surface of the one or more word lines and hard mask spacers disposed adjacent to the sidewalls of the one or more word lines.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown.

In the drawings:

FIGS. 2g-2k are cross-sectional portions taken along line W2 as indicated in FIG. 2a at various stages of a method according to one embodiment of the present invention;

DETAILED DESCRIPTION OF THE INVENTION

Figure 1A:
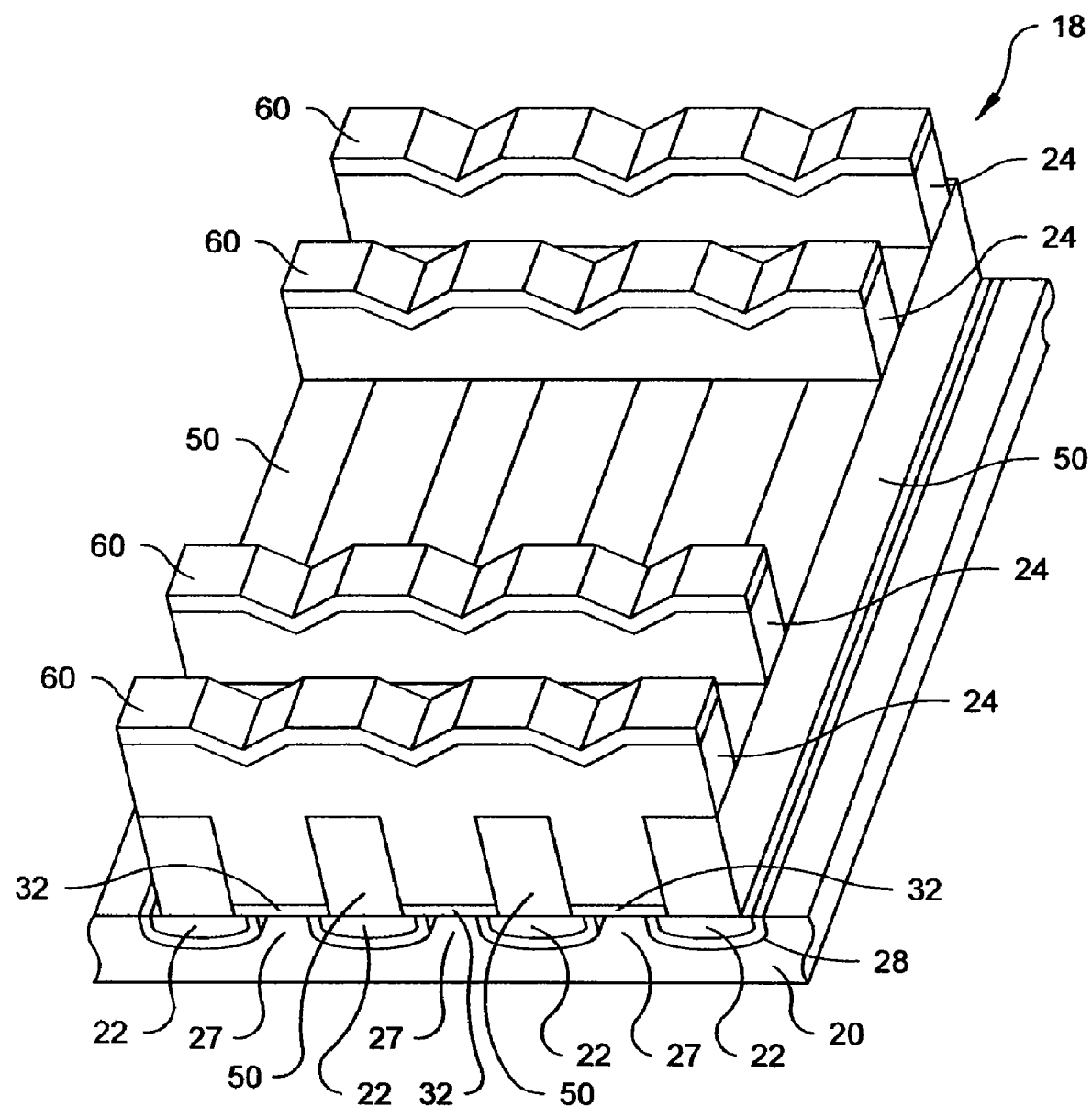
FIGS. 1a-1c are perspective view representations of a portion of a memory array prepared in accordance with a method according to one embodiment of the present invention at various points during the method.

Reference will now be made in detail to the invention and the presently preferred embodiments thereof, examples of which are illustrated in the accompanying drawings. Wherever possible, the same or similar reference numbers are used in the drawings and in the description to refer to the same or like parts. It should be noted that the drawings are in greatly simplified form and are not to precise scale. In reference to the disclosure herein, for purposes of convenience and clarity only, directional terms, such as top, bottom, left, right, up, down, above, below, beneath, rear, and front, are used with respect to the accompanying drawings. Such directional terms used in conjunction with the following description of the drawings should not be construed to limit the scope of the invention in any manner not explicitly set forth in the appended claims. Although the disclosure herein refers to certain illustrated embodiments, it is to be understood that these embodiments are presented by way of example and not by way of limitation. Also, it is to be understood and appreciated that the process steps and structures described herein do not cover a complete process flow for the manufacture of entire integrated circuits. The present invention may be practiced in conjunction with various integrated circuit fabrication techniques that are conventionally used in the art.

As used herein, and in the claims appended hereto, the indefinite articles "a" and "an," and the definite article "the" are not to be construed as limiting the element to which the article refers to the singular context. Thus, reference to "an" element can refer to one or more of the element. As used herein, the term "plurality" means two or more.

Methods in accordance with the present invention include providing a memory array. Referring to FIG. 1a, for example, a memory array 18 in accordance with an embodiment of the present invention is provided on a semiconductor substrate 20. Providing a memory array "on" a semiconductor substrate in accordance with various embodiments of the present invention refers to memory arrays having components disposed above and/or below an upper surface of the substrate, and/or directly on a substrate surface and/or in a substrate surface layer, and does not require or imply that all components of an array are disposed on top of the substrate. As used herein, a memory array refers to a semiconductor device containing two or more memory cells wherein each cell comprises a region generally defined by the intersection of a word line and two consecutive (i.e., neighboring) bit lines.

A memory array in accordance with the present invention generally includes a plurality of bit lines disposed below a surface of a substrate and a plurality of word lines disposed above the surface of the substrate. The word lines are disposed transverse to the bit lines. As used herein, "transverse" includes any alignment of word lines and bit lines where the word lines are disposed in a non-parallel arrangement with respect to the bit lines. Preferably, the word lines are arranged substantially perpendicular to the bit lines. As used herein, "substantially perpendicular" refers to word lines that are arranged at a 90°+/−15° angle to the bit lines, but does not imply that they are perfectly perpendicular to the bit lines.

Again referring to FIG. 1a, for example, a memory array 18 in accordance with one embodiment of the present invention includes a plurality of bit lines 22 disposed below a surface of the substrate 20 and a plurality of word lines 24 disposed above the surface of the substrate 20. In the embodiment depicted in FIG. 1a, the word lines 24 are arranged substantially perpendicular to the bit lines 22.

Semiconductor substrates which are suitable for use in accordance with the present invention include, but are not limited to, silicon materials or any other suitable semiconductor materials known or to be developed in the art. Silicon wafers prepared using standard techniques can be used as a substrate. For example, suitable wafers can be prepared using a process wherein silicon is grown from a small crystal, called the seed crystal, rotated and slowly withdrawn from a molten hyper-pure silicon to give a cylindrical crystal, which is then sliced to obtain thin disks, which after slicing, are finely ground, mirror-smooth polished and cleaned.

Bit lines disposed below a surface of a substrate in accordance with the present invention can be formed by any suitable means of doping used in semiconductor processing. For example, bit lines can be formed by providing a suitable patterning mask on or above the surface of the semiconductor substrate and subsequently implanting ions of a desired dopant type (e.g., n-type or p-type) at a desired level of doping below the surface of the semiconductor substrate using ion implantation. Bit lines in accordance with the present invention are generally disposed parallel to one another. As used herein, "parallel" refers to bit lines which are spaced apart from one another at an approximately equal distance along their entire length. However, "parallel" does not require that each of the bit lines be equally spaced from one another along their entire respective lengths. Generally, the plurality of bit lines in accordance with the present invention can be positioned in any manner, so long as the bit lines do not contact each other at any point along their length. However, it is to be understood that two or more bit lines may be connected to a common source line in conjunction with select transistors such that they remain separately operable.

Memory arrays in accordance with the present invention include both NPN-junction devices as well as PNP-junction devices. Methods in accordance with the present invention can be used to prepare both NPN-junction devices and PNP-junction devices. Thus, it should be understood that where any of the embodiments of the invention described herein refers to an NPN-junction wherein a semiconductor substrate comprises a p-type material having two or more bit lines (i.e., source/drain regions) formed via n-type doping, the memory cell/array described can also include a PNP-junction semiconductor device, and the methods of the present invention can be employed to prepare a PNP-junction semiconductor device.

A memory cell comprises the intersection of a word line and two consecutive bit lines. Thus, for example, a word line can function as a gate electrode and one bit line can function as a source region while the other bit line functions as a drain region. Each bit line can function as a source region or a drain region in a particular memory cell, depending upon the voltages applied, as understood in the art. As the operation of any particular bit line is interchangeable between its use as a source region and its use as a drain region, bit lines are synonymously referred to herein as "source/drain regions." The use of either term, "source" or "drain", separately is not to be construed as limiting a particular bit line in its function, or as limiting the invention in regard to any specific location of the source and the drain in a particular cell.

A memory cell further comprises a channel region. A channel region comprises the portion of the substrate below a word line and between two neighboring bit lines (i.e., source/drain regions). For example, referring to FIG. 1a, a channel region 27 comprises the portion of the substrate 20 between two bit lines 22 under a word line 24. Charge carriers can migrate from one source/drain region to a neighboring source/drain region across a channel region under the application of appropriate voltages to the bit lines and word line. Appropriate voltages may vary and can be selected and determined as known in the art or in view of new modes of electrical operation to be developed.

Additionally, in various embodiments of the present invention, pocket implantation of oppositely doped regions adjacent to one or more bit lines (source/drain regions) may optionally be carried out. For example, where the two or more source/drain regions comprise n+ doped regions, additional pocket implantation of highly p-doped smaller areas adjacent to one or more of the source/drain regions may be carried out. If a bit line is n-doped then a pocket implant can be p-doped and vice versa. In either case, it is preferred that the pocket implant is heavily doped in an effort to improve junction bias. Referring again to FIG. 1a, pocket implants 28 may optionally be formed in the substrate in at least a portion of an area adjacent to a bit line 22, and more preferably, along the entire interface between a bit line and the substrate in the channel region.

Memory arrays in accordance with the present invention also include a plurality of word lines disposed above a surface of a semiconductor substrate. For example, referring to FIG. 1a, in an embodiment of the present invention, a memory array can comprise a plurality of word lines 24 disposed above the semiconductor surface and transverse to the bit lines 22. A word line can comprise a conductively connected plurality of memory cell gates. In general, a gate comprises a conductive material disposed above a channel region of a memory cell. A gate can comprise any conductive material. For example, a gate can comprise a polycrystalline silicon material which may be either n-type or p-type doped, a metal silicide and/or a metal. Gates can be comprised of multiple layers. For example, a gate may comprise a polysilicon layer and a metal silicide layer disposed above the polysilicon layer. In some embodiments of the present invention, the polycrystalline silicon is n-type doped. Examples of suitable metal silicide gate materials include, but are not limited to tungsten silicides, titanium silicides, cobalt silicides, and nickel silicides, and combinations thereof.

Accordingly, in various embodiments of the present invention, a word line can comprise a generally linear and continuous conductive material and a series of gates disposed above a series of channel regions wherein the gates and the generally linear and continuous conductive material are in conductive contact with each other. As used herein, "conductive contact" refers, generally, to contact sufficient to permit movement of various charge carriers (e.g., electrons and holes) across the contact interface, but does not require any specific type or minimum amount of physical contact other than that which is sufficient to permit charge movement. The gates and the continuous portion of a conductive material, which together form a word line, may be comprised of different materials or may be comprised of a single material, or may each be comprised of layers of the same or different materials. For example, in one embodiment, the gate can comprise polysilicon and the continuous portion of a conductive material can comprise a layer of polysilicon and a layer of tungsten silicide disposed above the polysilicon layer. The plurality of word lines are generally parallel to one another and are disposed transverse to the bit lines. As used herein with respect to the word lines, "parallel" refers to word lines which are spaced apart from one another at an approximately equal distance along their entire length. However, "parallel" does not require that each of the bit lines be equally spaced from one another along their entire respective lengths. Generally, the plurality of word lines in accordance with the present invention can be positioned in any manner, so long as the word lines do not contact each other at any point along their length. However, it is to be understood that two or more word lines may be connected to a common line in conjunction with select transistors such that they remain separately operable.

A plurality of word lines in accordance with the present invention can be formed via any method of forming patterned word lines known or to be developed. Suitable methods include, but are not limited to, deposition of a masking layer or a photoresist layer, etching or developing a pattern in the masking layer, deposition of, for example, polysilicon, and removal of excess polysilicon outside of the pattern, for example, by chemical-mechanical polishing. Various patterning materials known or to be developed can be used. Additionally, various methods of deposition, including chemical vapor deposition techniques both known and to be developed can be used to deposit materials.

In various embodiments according to the present invention, one or more additional layers can be disposed above the channel region between the surface of the substrate and a word line. For example, a gate oxide or a charge storage layer can be disposed below each gate and above the substrate surface. A gate oxide layer can be deposited on the surface of the substrate using various techniques including thermal oxidation and chemical vapor deposition. Patterns can be etched using any suitable masking and etching methods, including both wet and dry etch techniques.

In certain embodiments of the present invention the memory cells can include a charge storage structure which is disposed above a channel region. For example, referring to FIG. 1a, a memory array in accordance with an embodiment of the present invention includes charge storage structures 32 disposed below word lines 24 in areas above the channel regions 27. A charge storage structure comprises any material or materials in which charge carriers can be stored to provide non-volatile memory. Suitable charge storage structures include both conductive floating gate materials and non-conductive charge trapping materials. In some embodiments, the charge storage structure comprises a charge trapping structure. As used herein, "charge-trapping structure" refers to any material, layer or multi-layer structure which is capable of trapping localized charge, wherein localization refers to trapped charge that exhibits little, if any, lateral movement within a charge trapping layer. Preferably, a charge-trapping structure in accordance with certain embodiments of the present invention comprises a multi-layered structure.

In certain preferred embodiments, suitable charge trapping structures include, for example, an oxide/nitride/oxide ONO trilayer, an oxide/nitride bilayer dielectric, a nitride/oxide bilayer dielectric, an ONONO multilayer, an oxide/tantalum oxide bilayer dielectric ($SiO_2/Ta_2O_5$), an oxide/tantalum oxide/oxide trilayer dielectric ($SiO_2/Ta_2O_5/SiO_2$), an oxide/strontium titanate bilayer dielectric ($SiO_2/SrTiO_3$), an oxide/barium strontium titanate bilayer dielectric ($SiO_2/BaSrTiO_2$), an oxide/strontium titanate/oxide trilayer dielectric ($SiO_2/SrTiO_3/SiO_2$), an oxide/strontium titanate/barium strontium titanate trilayer dielectric ($SiO_2/SrTiO_3/BaSrTiO_2$), an oxide/hafnium oxide/oxide trilayer dielectric, and the like (in each case, the first layer mentioned is the bottom layer while the last layer mentioned is the top layer). The charge trapping structure may also comprise a layer of silicon dioxide having two separate islands of polysilicon, sandwiched between two layers of silicon dioxide. Charge storage structures can be formed using any known or to be developed technique for forming or depositing the various materials. For example, various oxide layers may be formed using thermal oxidation routes or chemical vapor deposition techniques. Various nitride layers can be formed using nitridation techniques or chemical vapor deposition.

In some embodiments of the present invention, a charge trapping structure comprises three layers: a first dielectric layer, a charge trapping layer and a second dielectric layer. In certain preferred embodiments of the present invention, the charge trapping structure comprises an ONO structure (oxide layer-nitride layer-oxide layer), and even more preferably silicon dioxide layer-silicon nitride layer-silicon dioxide layer. The first dielectric layer in accordance with certain preferred embodiments of the present invention can comprise an oxide and can have a thickness of about 3 to about 10 nanometers. The charge trapping layer in accordance with certain preferred embodiments of the present invention can comprise a nitride layer and can have a thickness of about 3 to about 10 nanometers. The second dielectric layer in accordance with certain preferred embodiments of the present invention can comprise an oxide layer and have a thickness of about 3 to about 15 nanometers. Most preferably, an ONO structure comprises a first dielectric layer comprising a silicon oxide layer having a thickness of about 3 to about 10 nanometers, a charge trapping layer comprising a silicon nitride layer having a thickness of about 3 to about 10 nanometers, and a second silicon oxide layer having a thickness of about 3 to about 15 nanometers.

In some embodiments of the present invention, at least one bit line is at least partially covered by a dielectric material. The dielectric material may be in addition to a gate oxide layer or used in place thereof. The dielectic material may have any suitable thickness. The thickness may vary in accordance with the technology node of the device. For example, in a 130 nm technology node device, the dielectric material can preferably have a thickness of at least about 60 to about 140 nm. In some preferred embodiments of present invention, each bit line can be at least partially covered with a dielectric material. In certain preferred embodiments, each bit line can be covered by a dielectric material along its entire length. For example, referring to FIG. 1a, a dielectric material 50 is disposed above each bit line 22 along the entire length of each bit line 22.

Accordingly, some embodiments of the methods according to the present invention include providing a memory array wherein at least one of the bit lines is at least partially covered by a dielectric material, and preferably covered along its entire length. Additionally, certain embodiments of memory arrays according to the present invention include a dielectric material disposed above one or more, and in certain preferred embodiments, each of the bit lines. As used herein with reference to the dielectric material disposed above one or more of the bit lines, "above" refers to the dielectric material being positioned generally above the surface of the substrate below which the bit lines are disposed. The dielectric material can preferably have a width equal to the width of the bit lines.

The dielectric material disposed above and at least partially covering one or more or all of the bit lines can be comprised of any electrically insulating material which is suitable for use in semiconductor devices. Suitable materials are known in the art or may be developed in the future. Examples of suitable dielectric materials include aluminum oxide and silicon dioxide and combinations thereof. In certain preferred embodiments of the present invention, the dielectric material disposed above one or more of the bit lines comprises high density plasma (HDP) silicon oxide. HDP oxides can be deposited using any suitable high density plasma technique which is known or to be developed. In various embodiments of the memory arrays and methods according to the present invention, each bit line can be covered along its entire length by an HDP silicon oxide material.

The methods of the present invention include forming a hard mask material layer over the plurality of word lines. Similarly, memory arrays according to the present invention include a hard mask material disposed over the word lines. As used herein, "over" refers to a hard mask material which is disposed above, beside, between and/or around the word lines so as to cover the exposed surfaces of the word lines and other exposed surfaces of the memory array except as discussed below with respect to openings in the hard mask material. A hard mask material can comprise any suitable material for durable masking that is known or to be developed in the art. Preferably, a hard mask material comprises a material that is resistant to etching recipes which are suitable for etching an insulating material layer disposed above the hard mask material layer. Thus, for example, where an insulating material layer comprises an oxide, the hard mask material layer can comprise a material which is resistant to etch recipes used to remove oxide materials. In certain preferred embodiments of the present invention, the hard mask material comprises a silicon nitride $Si_xN_y$ (e.g., $Si_3N_4$).

A hard mask material layer is disposed above the word lines such that an area above at least one of the bit lines and between two consecutive word lines is exposed below an opening in the hard mask material layer. An opening in the hard mask material layer can comprise an appeture or void in the layer of any suitable size, as described below, below which the memory array is exposed (i.e., is not covered by the hard mask material layer). A hard mask material layer can comprise a plurality of openings such that an area above each bit line is exposed below an opening in the hard mask material layer. Reference to an area "above" a bit line can refer to an opening which is disposed directly above a bit line, or an opening above one or more additional materials above the bit line, such as, for example, a gate oxide layer or another dielectric material such as an HDP oxide. Thus, an area above the bit line which is exposed below an opening in the hard mask material layer can be an area of the substrate surface, and area of a gate oxide layer, an area of another suitable dielectric material above the bit line or any other material disposed above the bit line.

Figure 1B:
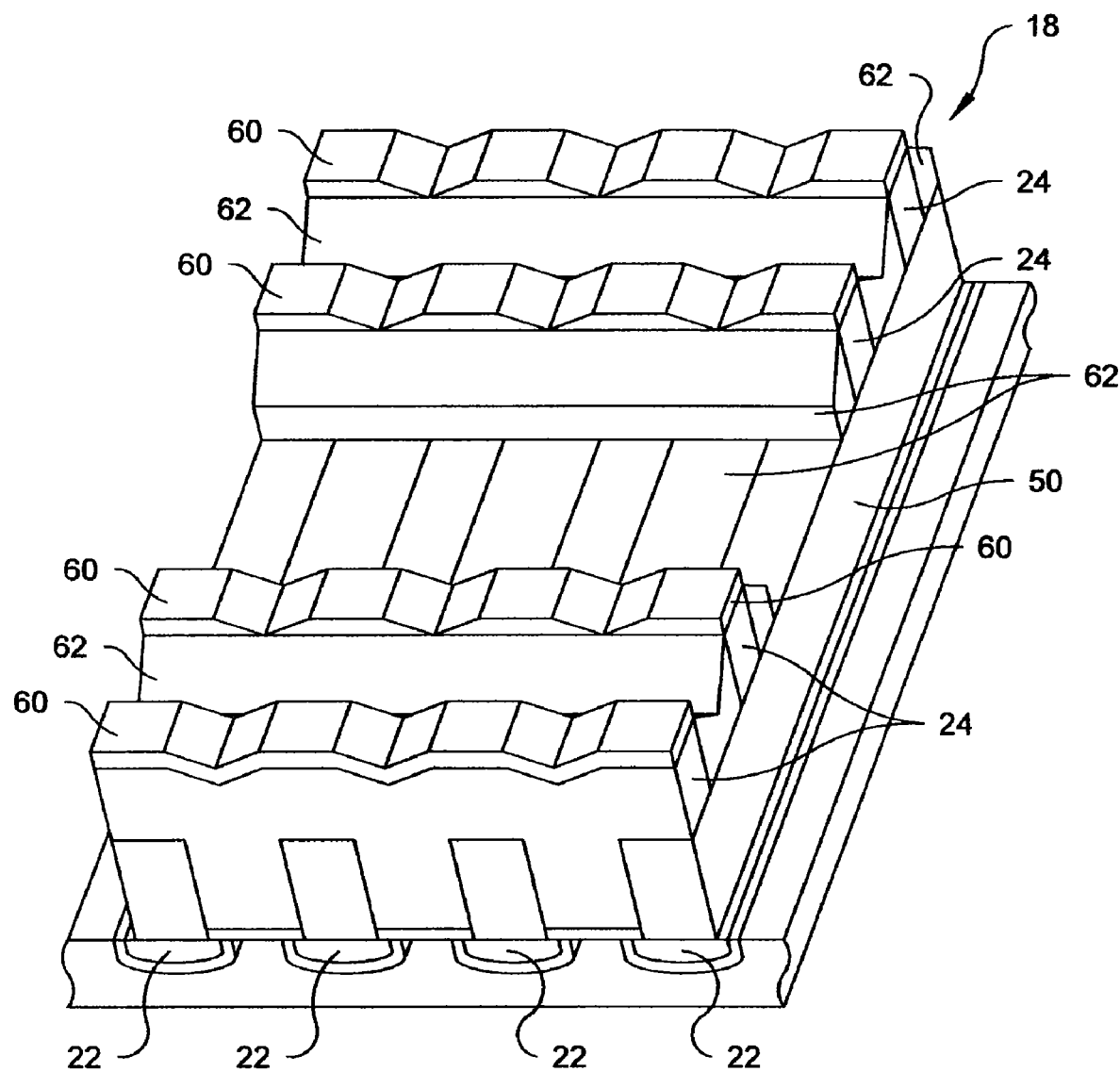

A hard mask material layer can be formed by various methods including blanket deposition of a hard mask material followed by selective anisotropic etching to remove the portion of the hard mask material layer above a bit line between two consecutive word lines. In certain embodiments according to the present invention, a hard mask material layer can comprise a capping layer of hard mask material disposed on an upper surface of a word line and hard mask spacers disposed on the sidewalls of the word line. Accordingly, in certain embodiments, a word line can be shaped such that it has a distinct upper surface and sidewalls. In certain embodiments, each word line has an upper surface and sidewalls and the hard mask material layer comprises a capping layer of the hard mask material disposed on the upper surface of each word line and hard mask spacers on the sidewalls of each word line. For example, referring to FIGS. 1a and 1b, a hard mask material layer can comprise capping layers 60 disposed above the upper surfaces of the word lines 24 and hard mask spacers 62 disposed on the sidewalls of the word lines 24 and in between optional dielectric materials 50 disposed above bit lines 22.

In certain preferred embodiments of the present invention wherein the hard mask material layer comprises a capping layer on the upper surfaces of the wordlines and hard mask spacers on the sidewalls of the word lines, the capping layers can be formed subsequent to the deposition of the word line material using the same patterning mask used to form the word lines. For example, referring to FIG. 1a, hard mask capping layers 60 can be disposed above word lines 24 during the formation of the word lines. Hard mask spacers can be formed after removal of the word line patterning mask by blanket deposition of a hard mask material and anisotropic etching of the hard mask material between two consecutive word lines.

For example, in various embodiments of the present invention, a silicon nitride material can be blanket deposited over the word lines and memory array using a suitable chemical vapor deposition technique for silicon nitride. In certain preferred embodiments, the layer of silicon nitride can have a thickness of about 2000 Å to about 3000 Å. The layer of silicon nitride is then anisotropically etched using an etch recipe that is selective for the blanket-deposited mask material (e.g., the silicon nitride). Preferably, the etch recipe is highly selective between the hard mask material and the underlying material disposed above the bit lines. For example, where an oxide is disposed above the bit lines and the hard mask material comprises a nitride, an etch recipe can be used which is highly selective for the nitride such that the underlying oxide is not removed by the etch recipe. Once the underlying oxide material is detected, the etching can be stopped, thus leaving an opening in the hard mask material below which the oxide material disposed above the bit line is exposed. Suitable etch recipes which are selective for various materials over others are known in the art and can be readily determined. For example, etching chemistries which are selective for silicon nitride but which remove minimum amounts of silicon oxide include various etch mixtures having high (e.g., greater than 1) C:F (carbon-to-fluorine) ratios and which also include $O_2$ in the mixture.

Figure 1C:
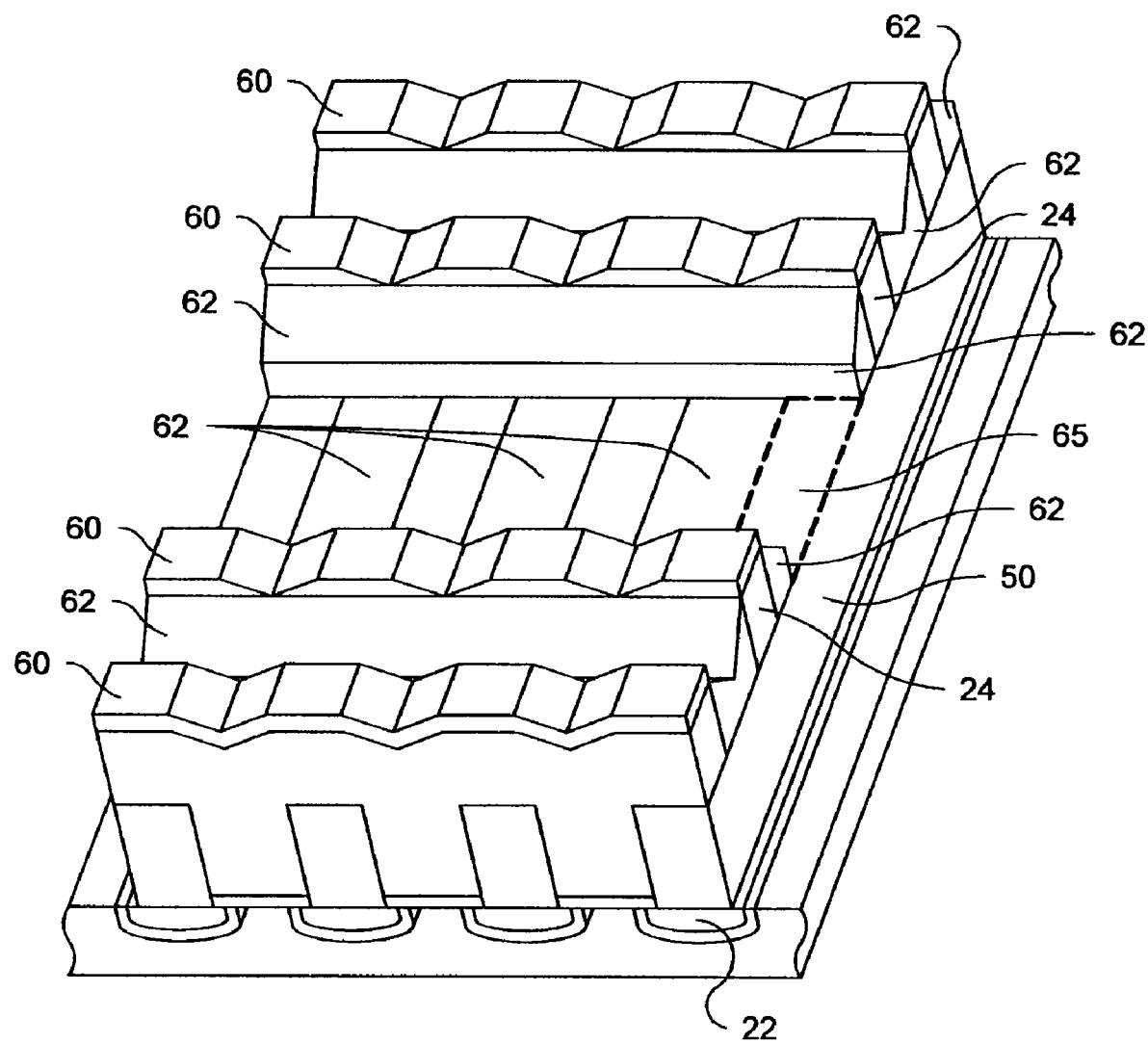

Referring to FIG. 1c, for example, an opening in the hard mask material layer can be formed by the removal of hard mask spacer material between two consecutive word lines 24 above the dielectric material 50 which is disposed above a bit line 22. In the embodiment depicted in FIG. 1c, the hard mask material layer comprises hard mask capping layers 60 and hard mask spacers 62. An opening in the hard mask material layer exposes an area 65 above the dielectric material 50.

Methods in accordance with the present invention include forming an insulating material layer above the hard mask material layer. Additionally, memory arrays according to the invention include an insulating material layer disposed above the hard mask material. An insulating material layer can comprise any dielectric material suitable for use in semiconductor devices, and preferably, which can be etched or patterned without significant removal of the underlying hard mask material layer. Suitable insulating materials include, but are not limited to oxides, such as silicon oxide and borophosporosilicate glass (BPSG). An insulating material layer can be formed over the entire memory array.

An insulating material layer can be comprised of multiple layers of dielectric materials. For example, in some embodiments, the insulating material layer can comprise an interlayer dielectric layer (ILD) and an intermetal dielectric layer (IMD). An ILD can be formed using any suitable means which can depend on the material used. In certain embodiments, the ILD can comprise BPSG. In embodiments where the ILD comprises BPSG, the BPSG can be deposited using chemical vapor deposition, then heated to a temperature of about 700° C. to 950° C., and then allowed to cool. The ILD can be subjected to planarization such as, for example, chemical-mechanical polishing. The thickness of an ILD can vary according to the technology node of the device and thickness of the memory cell stack, but in general, can be about 300 nm to about 700 nm after planarization.

An IMD includes a layer of dielectric material disposed above an ILD. Suitable IMD materials are preferably dielectric materials which are stronger and more dense in comparison to ILD materials. While any dielectric material known or to be developed which is suitable for use in semiconductor devices can be used in an IMD, preferable IMD materials include, for example, oxides which are deposited using high density plasma chemical vapor deposition techniques and/or plasma enhanced chemical vapor deposition (PE-CVD) techniques. After forming an IMD above an underlying ILD or other insulating material layer, the IMD can be subjected to planarization, such as, for example, chemical-mechanical polishing.

In certain preferred embodiments of the present invention, the IMD comprises a PE-CVD oxide (PEOX). The thickness of an IMD can also vary in accordance with the technology node of the device and the thickness of the cell stack, but can generally be about 300 nm to about 700 nm.

Methods in accordance with the present invention include forming a contiguous trench and via pattern in the insulating material layer. A contiguous trench and via pattern refers to a void space into which a conductive material can be disposed to form an interconnection comprised of a continuous wiring trench and via. A contiguous trench and via pattern comprises a trench portion and a via portion. The contiguous trench and via pattern can be disposed in the insulating material layer above the area exposed below the opening in the hard mask material layer. The trench portion of the contiguous pattern is disposed in the insulating material layer wherein the hard mask material layer can serve as the bottom of the trench portion of the pattern. The via portion of the contiguous pattern extends through the opening in the hard mask material layer to the surface of the semiconductor substrate such that a portion of the at least one bit line is exposed below the pattern.

As used herein, "contiguous" refers to the unified quality of the trench and via portions of the pattern. Thus, for example, an array in accordance with the present invention can include a plurality of contiguous trench and via patterns wherein each pattern is separate from the others.

In certain embodiments, openings in the hard mask material layer can be disposed above each bit line. In such embodiments, a contiguous trench and via patterns can be formed in the insulating material layer above each bit line such that a via portion of the a contiguous pattern extends through each opening in the hard mask material layer to the surface of the semiconductor substrate such that each bit line is exposed.

When filled with a conductive material, the trench portion of the contiguous pattern constitutes what is often referred to as a wire portion of an interconnection which is generally disposed in a plane parallel to the semiconductor substrate surface, and each via (when filled with a conductive material) constitutes what is often referred to as a contact which conductively connects the wire portion and an underlying device structure, i.e., a bit line. The formation of the pattern in the insulating material layer can be carried out using a single masking step such that the trench portion and via portion(s) are formed with, for example, a single photoresist pattern formed above the insulating material layer.

In various embodiments of the present invention, a contiguous trench and via pattern can be formed using photolithographic techniques known in the art or to be developed. For example, forming a contiguous trench and via pattern can include depositing a photoresist material on an upper surface of the insulating material layer and developing a pattern in the photoresist material. Generally, the pattern in the photoresist material can correspond to the trench portion of the contiguous trench and via pattern. For example, where the trench portion of a contiguous trench and via pattern is to be arranged in a linear fashion over the bit line, the pattern in the photoresist material will similiarly be disposed in a linear arrangement above the bit line. Any suitable photoresist material can be used. After a pattern is formed in the photoresist material, the insulating material layer and other portions of the structure below the photoresist pattern which are disposed below one or more openings in the hard mask material layer can be removed, for example, via etching.

In some embodiments, an antireflective coating (ARC) can be deposited above the insulating material layer and below the photoresist material. The ARC can be comprised of any suitable optically absorptive material known or to be developed suitable for use with photoresist materials. Examples of suitable antireflective materials which can be used in an ARC in certain embodiments of the present invention include, but are not limited to, oxynitrides such as silicon oxynitride.

After a pattern is formed in the photoresist material, the insulating material layer below can be subjected to etching to form the contiguous trench and contact pattern(s). An etching recipe can be used which selectively removes the insulating material layer and any materials exposed below the one or more openings in the hard mask material layer exposing the surface of the semiconductor substrate below which the bit lines are disposed. Any suitable etching recipe can be used. For example, where the hard mask material comprises silicon nitride and the materials to be removed comprise oxides, a carbon/hydrogen/fluorine-based etch recipe can be used. The removal of the insulating material layer above an opening in the hard mask material layer and the removal of the materials disposed below the opening provides a contiguous trench and via pattern, which can be filled with a conductive material to form an interconnection.

Methods in accordance with the present invention include forming an interconnection. An interconnection comprises a conductive material disposed in a contiguous trench and via pattern such that the conductive material is in conductive contact with the bit line exposed below the contiguous pattern. Any conductive material can be used including, for example, metals, metal silicides, and polysilicon which may be n-doped or p-doped. In various preferred embodiments, the conductive material comprises a metal. In certain more preferred embodiments, the metal comprises tungsten. The conductive material can be deposited using any means known or to be developed in the ar, including, for example, vapor deposition techniques such as chemical vapor deposition. In certain embodiments, the conductive material can comprise tungsten deposited using chemical vapor deposition. After the conductive material is deposited in the contiguous trench and via pattern, the upper surface of the insulating material layer can be subjected to planarization to remove any conductive material which is outside of the pattern. Suitable planarization methods include chemical-mechanical polishing. In certain preferred embodiments of the invention, the conductive material comprises tungsten deposited in the pattern using chemical vapor deposition which is subsequently planarized using chemical-mechanical polishing. Additional layers can be formed above the insulating material layer after formation of the interconnection.

Memory arrays according to the present invention thus comprise a plurality of bit lines disposed below a surface of a semiconductor substrate; a plurality of word lines disposed above the surface of the substrate and transverse to the bit lines; wherein an area above at least one of the bit lines and between two consecutive word lines is exposed below an opening in the hard mask material; an insulating material layer disposed above the hard mask material; and an interconnection comprising a contiguous conductive material-filled trench and via disposed in a pattern formed in the insulating layer such that the conductive material-filled via extends through the opening in the hard mask material and is in conductive contact with the at least one of the bit lines.

In certain embodiments of the present invention where an interconnection comprises more than one conductive material-filled via in conductive contact with the bit line, each of the vias is separated from one another above the bit line by at least two word lines.

Figure 2A:
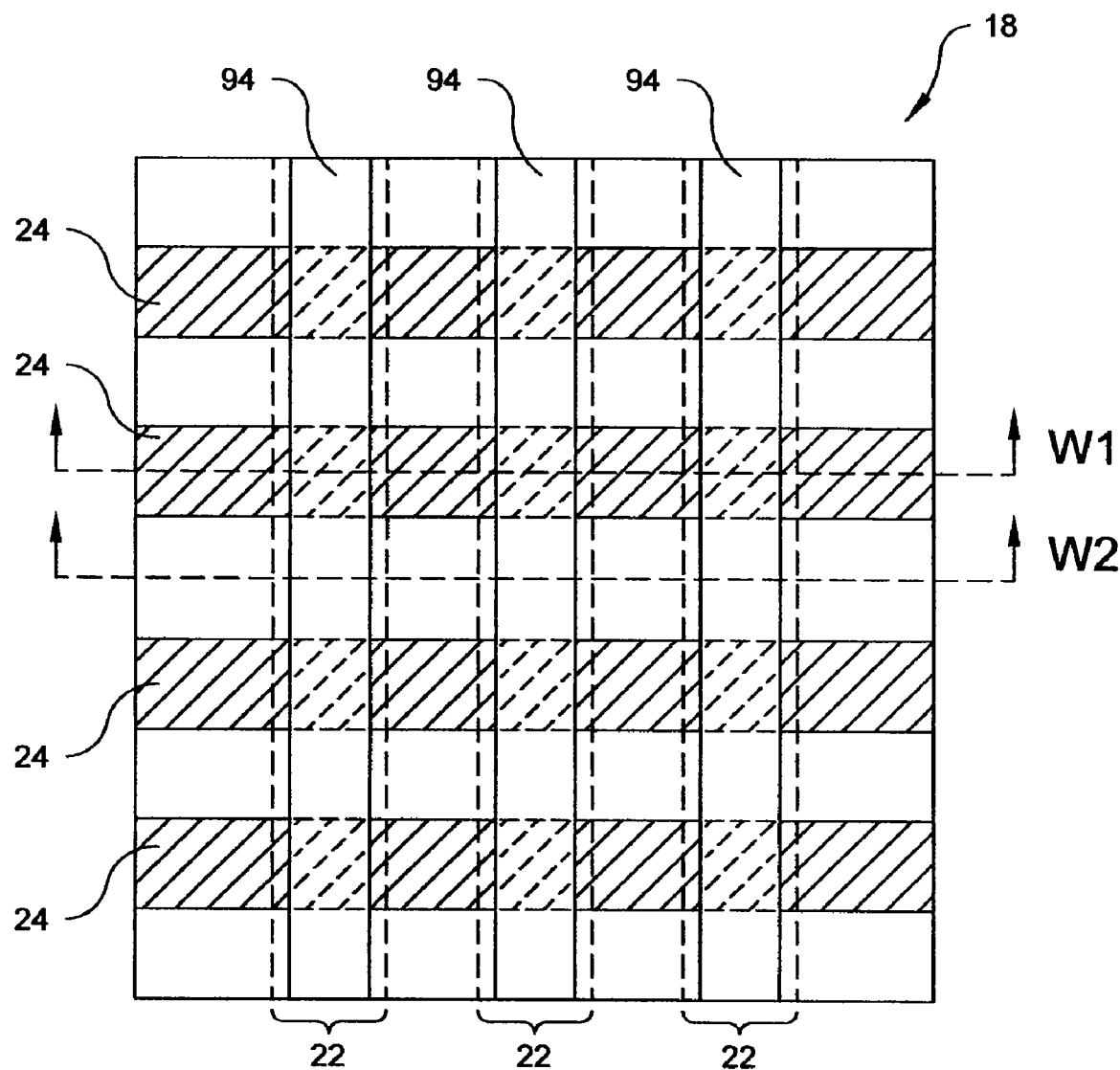
FIG. 2a is a top view representation of a portion of a memory array prepared by a method according to one embodiment of the present invention.

A method in accordance with one embodiment of the present invention will now be described in more detail with reference to FIGS. 2a-2k and FIGS. 3a-3k. FIG. 2a and FIG. 3a are top view schematic representations of a memory array 18 prepared in accordance with one embodiment of a method according to the present invention. As shown in FIGS. 2a and 3a, wordlines 24 are disposed above the surface of a substrate on which the memory array 18 is prepared. The word lines 24 are disposed transverse to the bit lines 22 which are disposed below the surface of the substrate. In the embodiment depicted in FIGS. 2a and 3a, the word lines 24 are substantially perpendicular to the bit lines 22. Interconnections 94 are disposed over the word lines 24 and, in the embodiment shown, are substantially parallel to the bit lines 22 below the surface of the substrate. FIG. 2a indicates cross-sectional lines along which the views shown in FIGS. 2b-2k are taken. FIGS. 2b-2f are taken along the cross-sectional line W1 which is along a word line 24. FIGS. 2g-2k are taken along cross-sectional line W2 which is between two consecutive word lines. FIG. 3a indicates cross-sectional lines along which the views shown in FIGS. 3b-3k are taken. FIGS. 3b-3f are taken along the cross-sectional line B1 which is between two consecutive bit lines. FIGS. 3g-3k are taken along cross-sectional line B2 which is along a bit line.

Figure 2B:
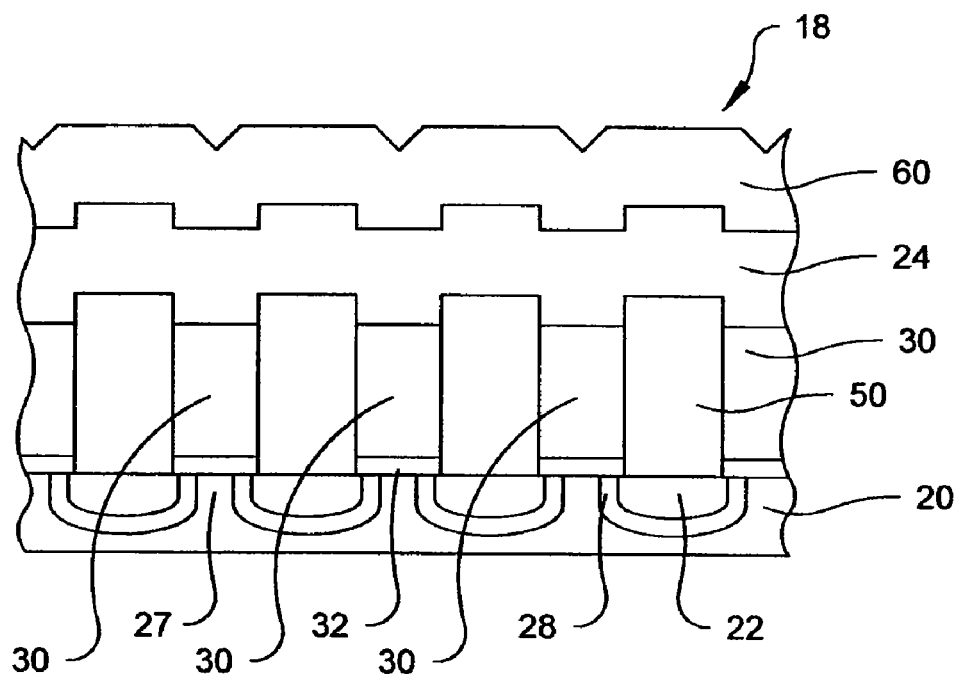
FIGS. 2b-2f are cross-sectional views taken along line W1 as indicated in FIG. 2a at various stages of a method according to one embodiment of the present invention.
Figure 2C:
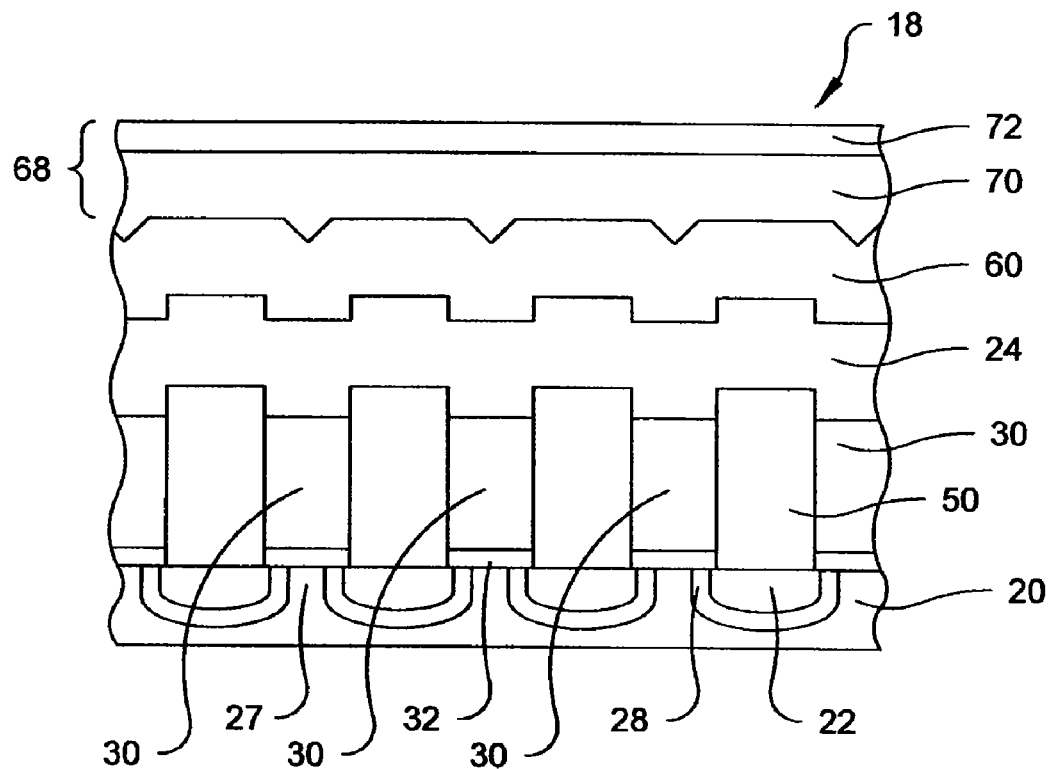
Figure 2D:
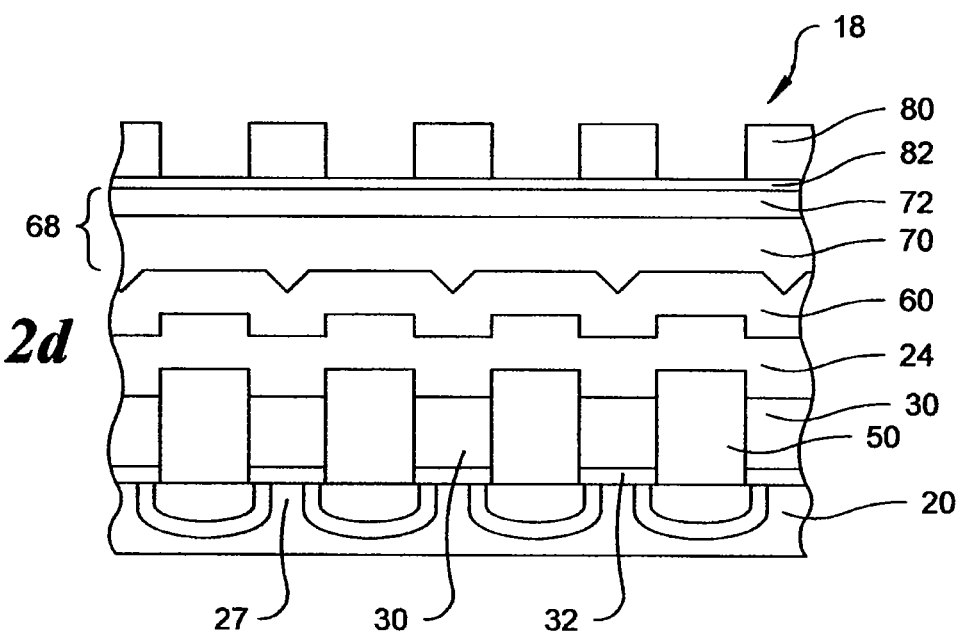
Figure 2E:
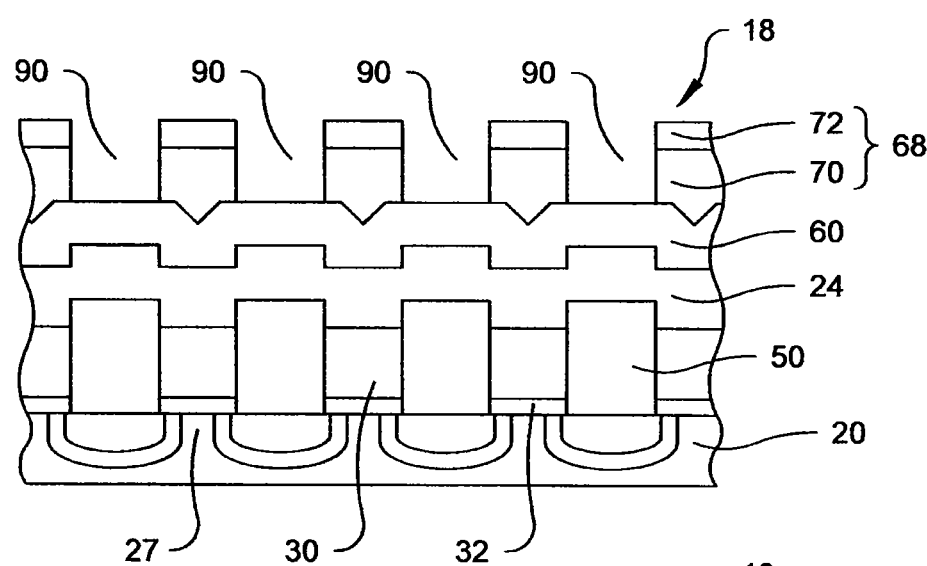
Figure 2F:
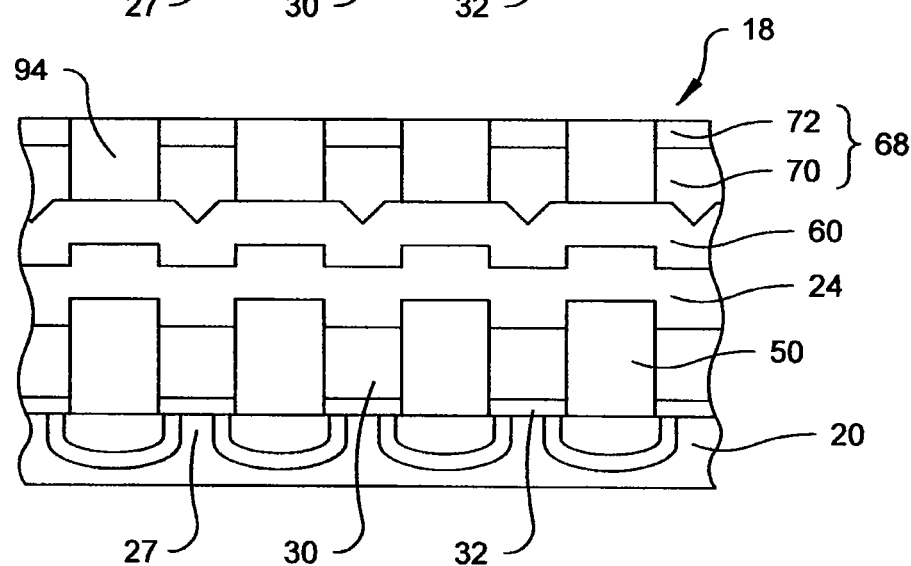
Figure 2J:
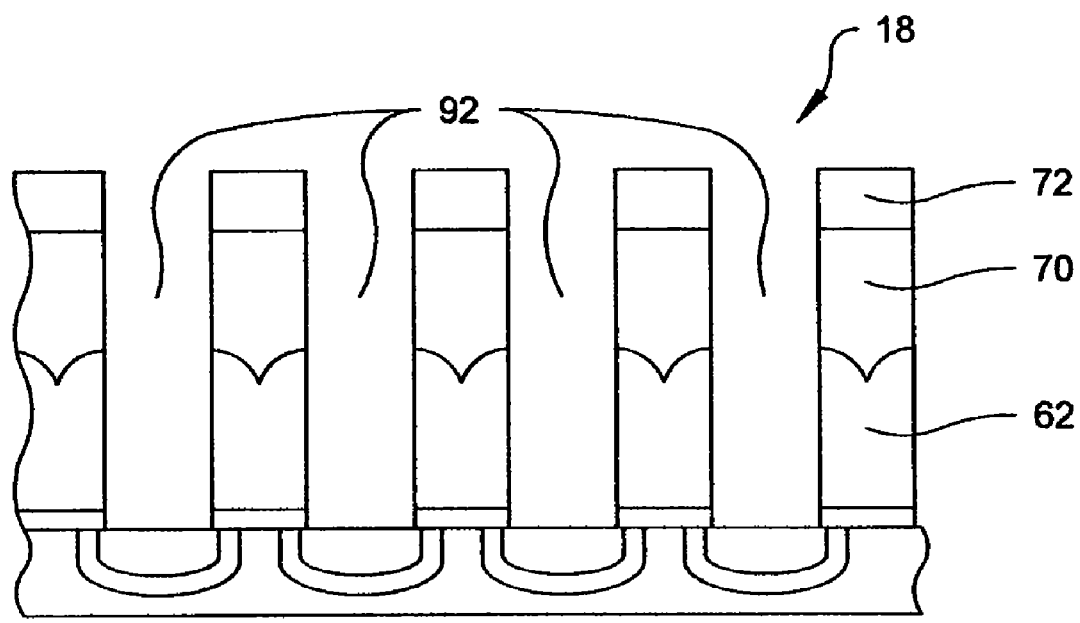
Figure 2K:
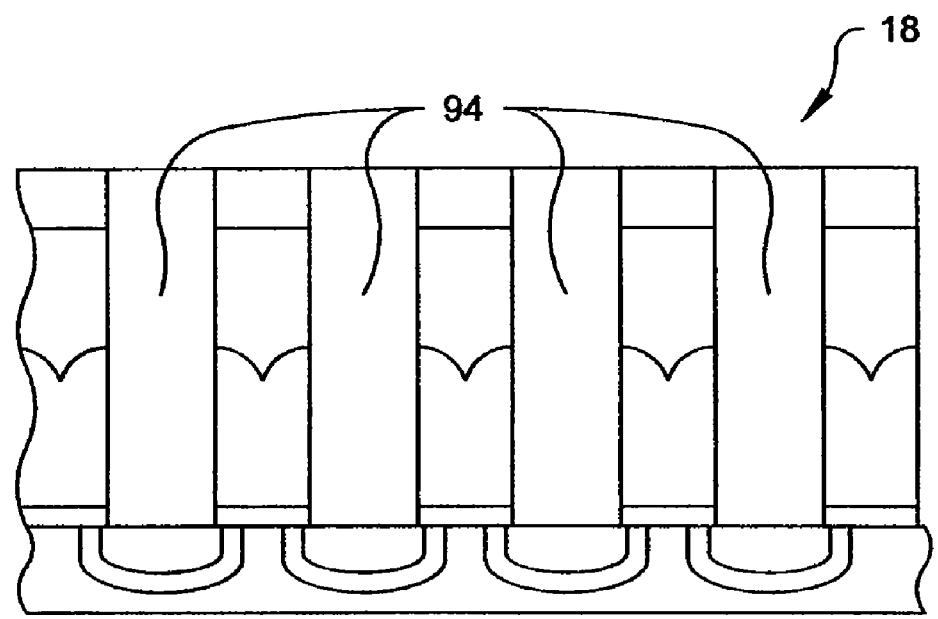
Figure 3A:
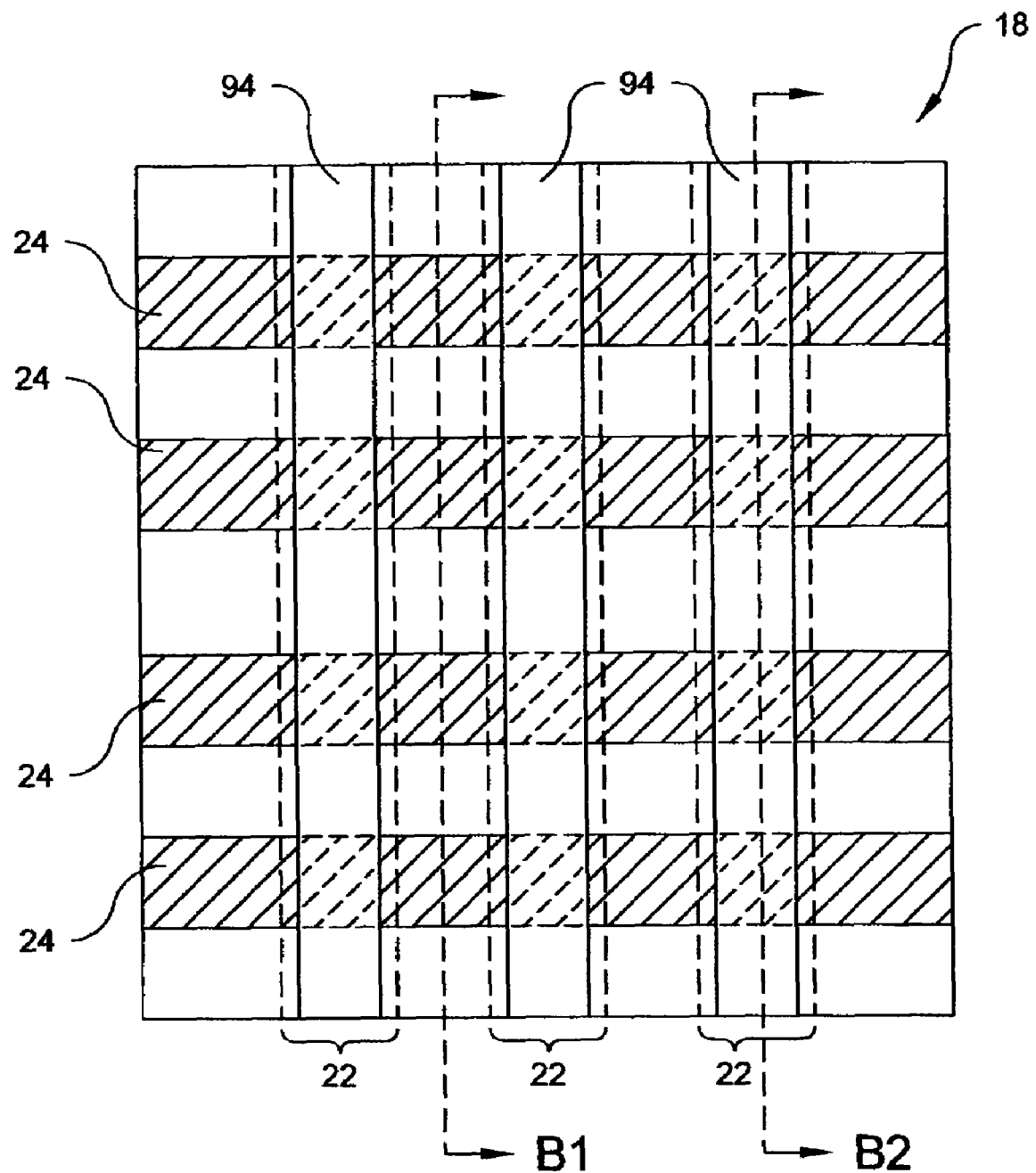
FIG. 3a is a top view representation of a portion of a memory array prepared by a method according to one embodiment of the present invention.
Figure 3B:
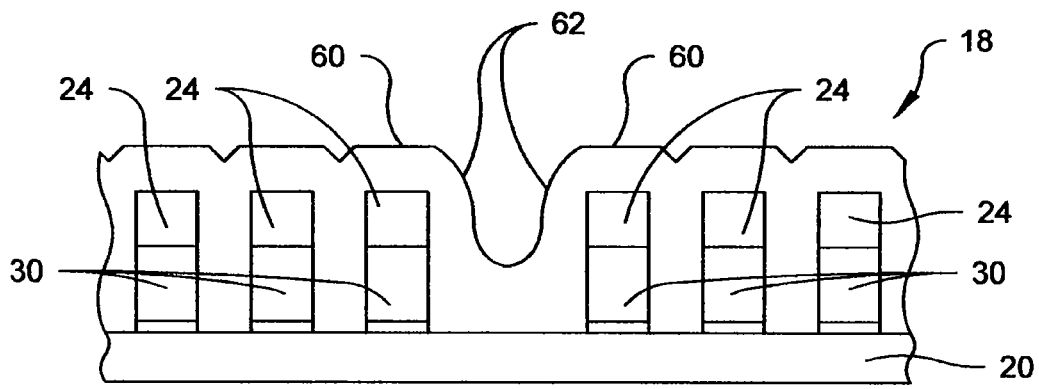
FIG. 3b-3f are cross-sectional portions taken along line B1 as indicated in FIG. 3a at various stages of a method according to one embodiment of the present invention.

Referring to FIGS. 2b and 3b (and with reference to FIGS. 2g and 3g), a memory array 18 is provided having a plurality of bit lines 22 disposed below a surface of a semiconductor substrate 20, a plurality of word lines 24 disposed above the surface of the substrate 20 and substantially perpendicular to the bit lines 22. The memory array has a dielectric material 50 disposed above each of the bit lines 22. The memory array has charge storage structures 32 disposed above channel regions 27. In the embodiment depicted in FIGS. 2a-2k and FIGS. 3a-3k, each wordline comprises a generally linear and continuous conductive material (represented by the portion identified as 24) and a series of gates 30 disposed above the charge storage structures 32, where the gates 30 and the generally linear and continuous conductive material 24 are in conductive contact with each other. The gates 30 and the generally linear and continuous conductive material may be separately formed and may be comprised of the same or different conductive materials. The memory array has pocket implants 28 disposed adjacent to bit lines 22. A hard mask material layer (comprising capping layers 60 disposed above word lines 24 and hard mask spacers 62 disposed on the sidewalls of the word lines and between the dielectric materials 50) is formed over the word lines of the array such that an area 65 above each bit line (e.g., as depicted in FIG. 3g) is exposed below an opening 66 in the hard mask material layer.

Figure 3C:
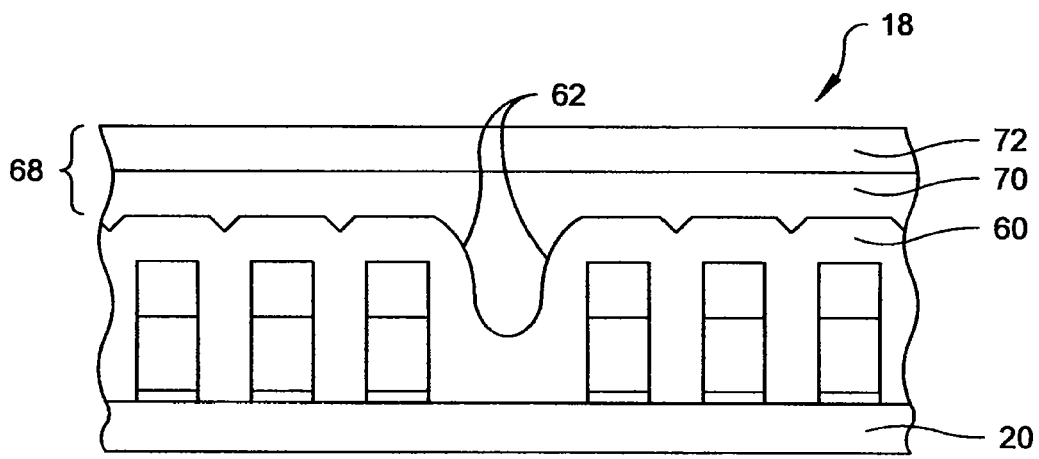

Referring to FIGS. 2c and 3c (and with reference to FIGS. 2h and 3h), an insulating material layer 68 which can be comprised of an interlayer dielectric layer 70 and an intermetal dielectric layer 72 is formed over the array.

Figure 3D:
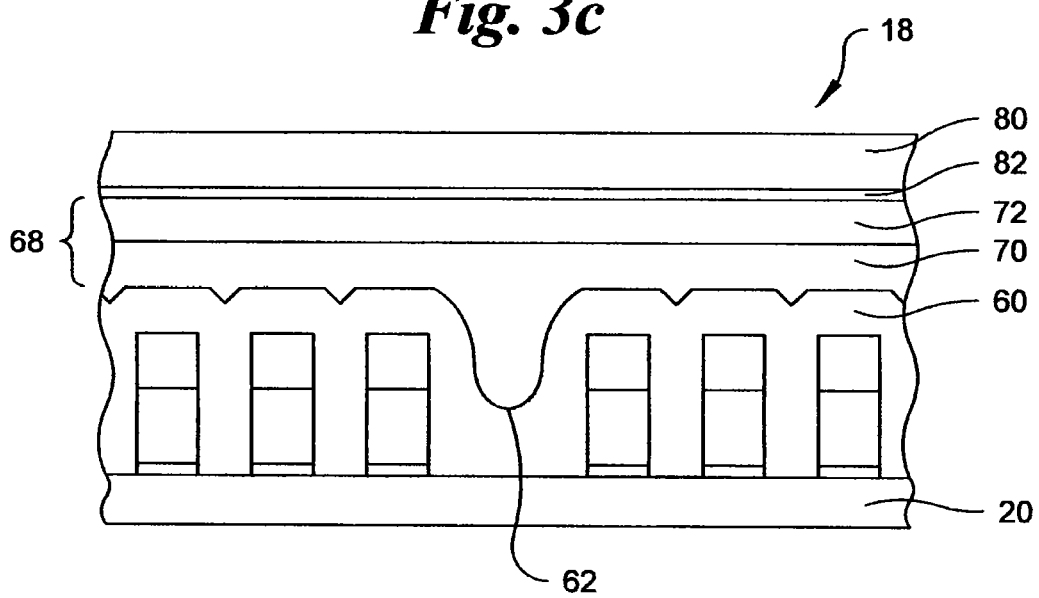

Referring to FIGS. 2d and 3d (and with reference to FIGS. 2i and 3i), an antireflective coating 82 and a photoresist material 80 are formed above the insulating material layer 68 and patterned such that the antireflective coating 82 above the insulating material layer 68 is exposed below the photoresist pattern in areas above the bit lines 22.

Figure 3E:
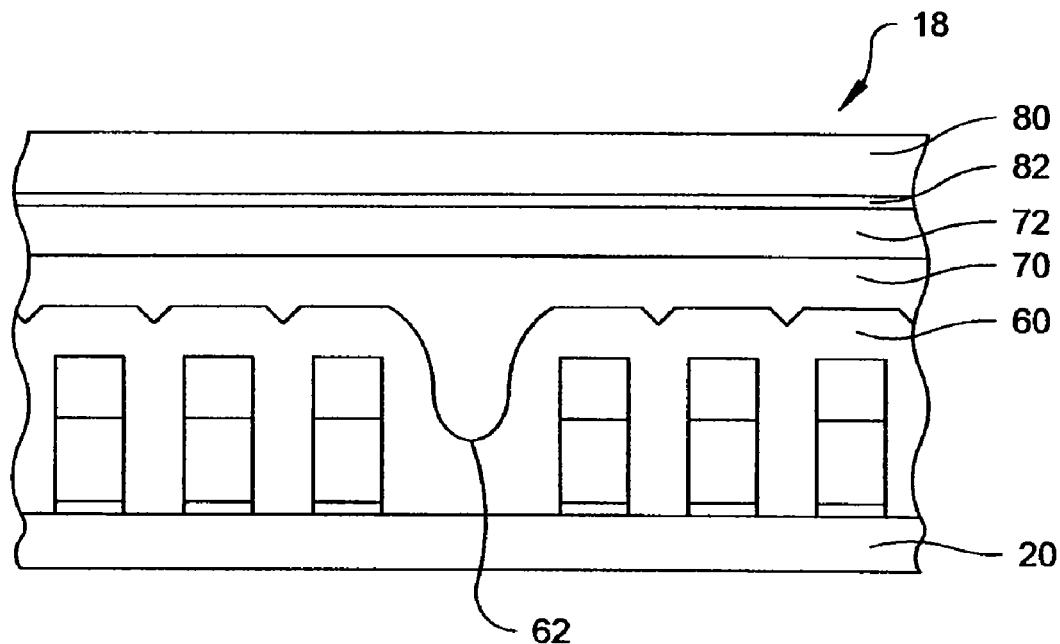

Referring to FIGS. 2e and 3e (and with reference to FIGS. 2j and 3j), the insulating material layer, comprising the interlayer dielectric layer 70 and an intermetal dielectric layer 72, disposed below the pattern formed in the photoresist material 80 and the dielectric material 50 below the area 65 are removed via etching to form contiguous trench and via patterns comprised of trench portions 90 and via portions 92.

Figure 3F:
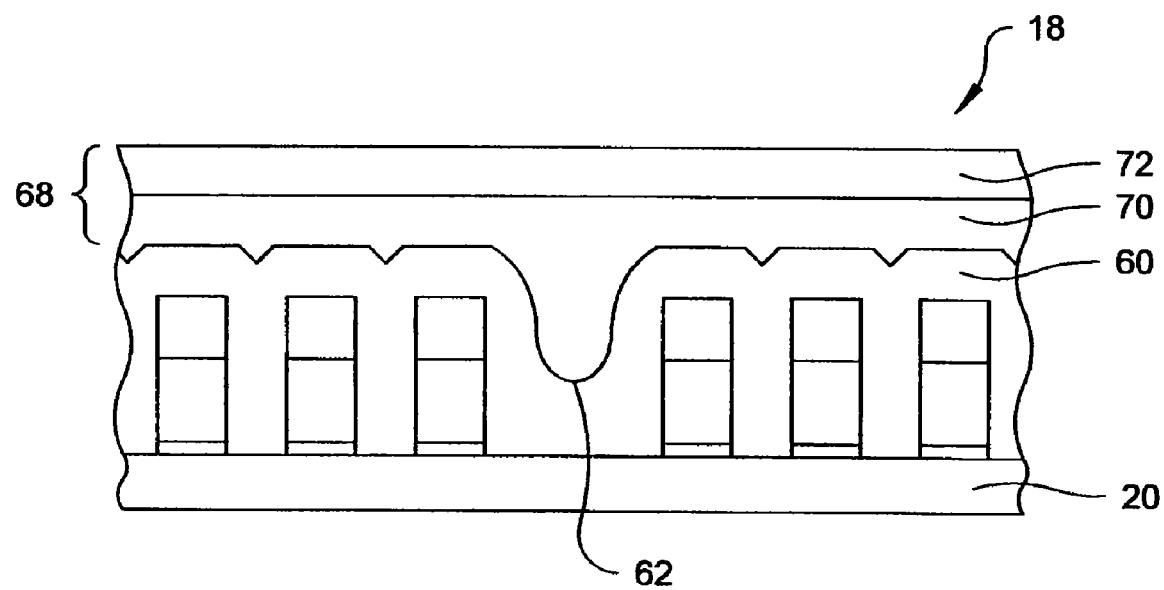
Figure 3G:
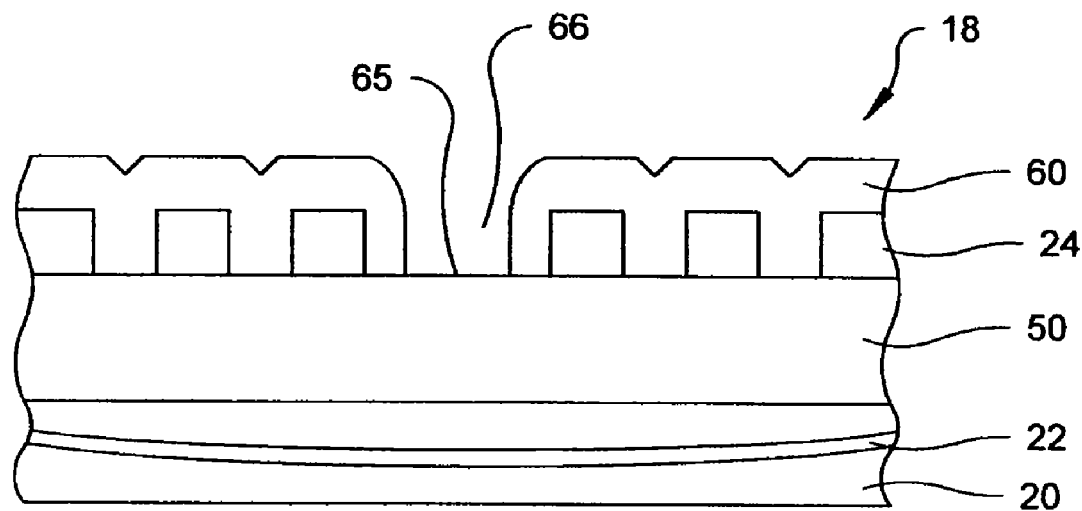
FIG. 3g-3k are cross-sectional portions taken along line B2 as indicated in FIG. 3a at various stages of a method according to one embodiment of the present invention.
Figure 3H:
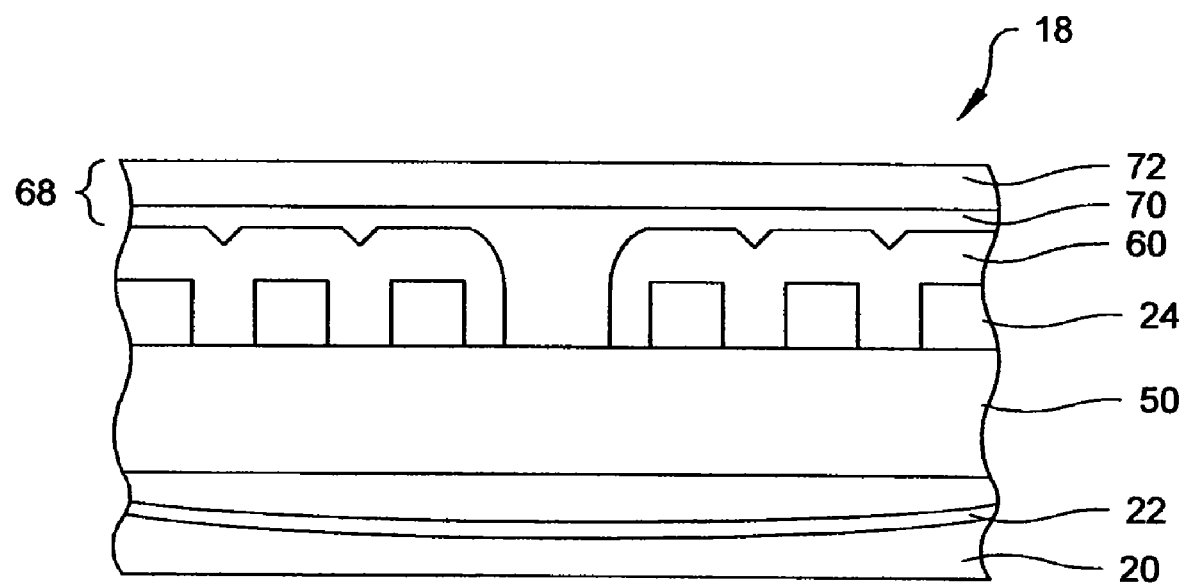
Figure 3I:
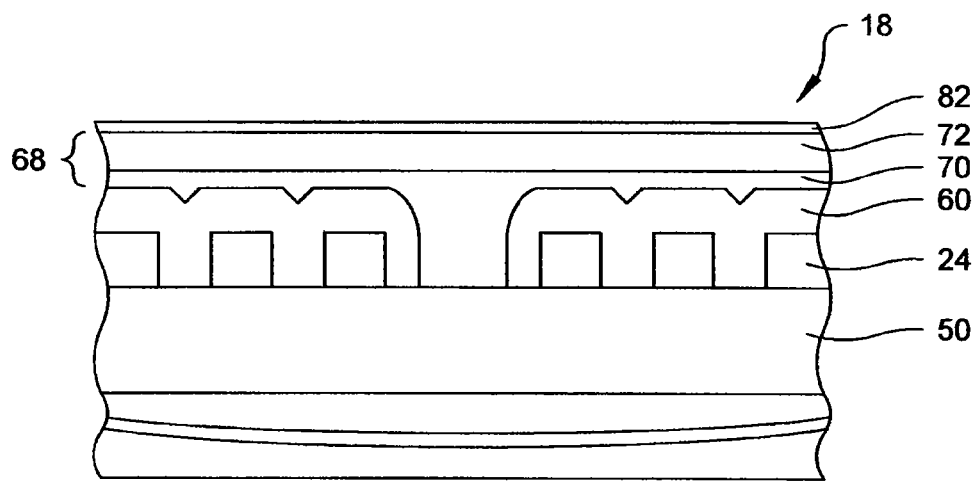
Figure 3J:
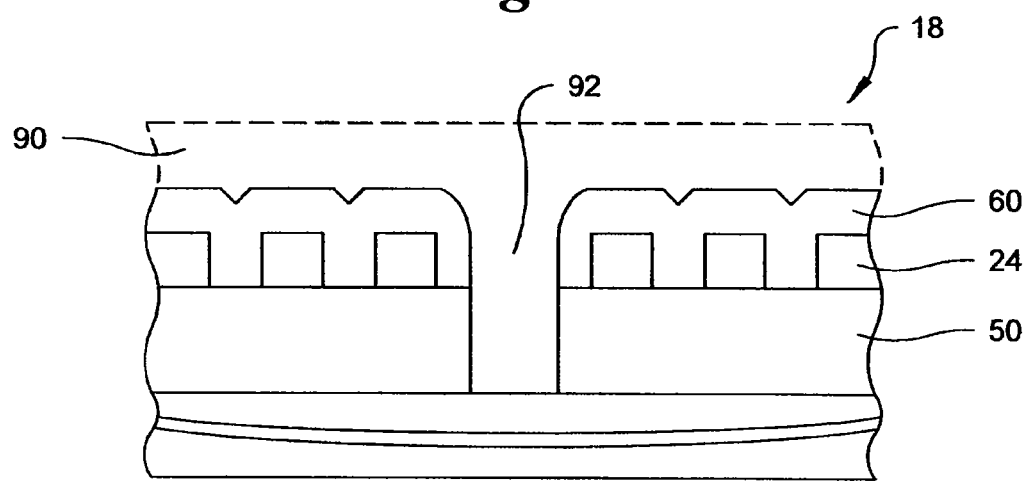
Figure 3K:
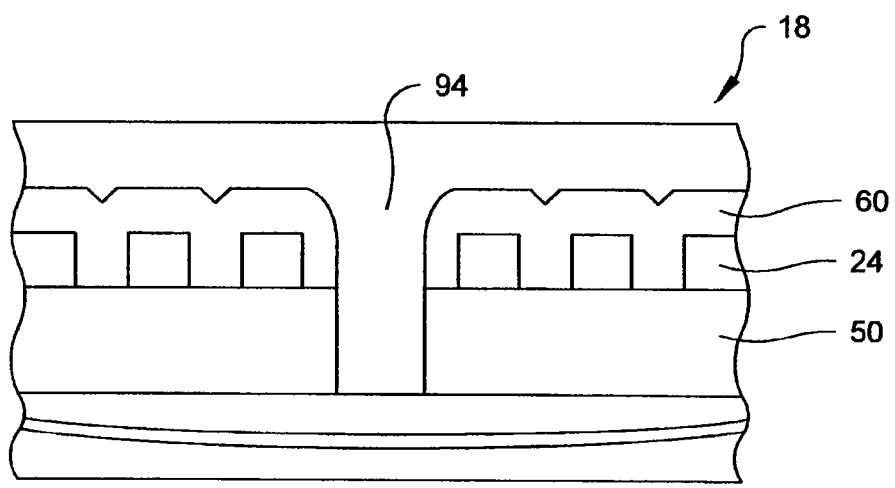

Referring to FIGS. 2f and 3f (and with reference to FIGS. 2k and 3k), interconnections 94 are formed by filling the contiguous trench and via patterns with a conductive material such that the conductive material is in conductive contact with the bit line 22 exposed below the contiguous pattern.

Interconnections prepared in accordance with the present invention do not suffer from overlay alignment problems which are common in semiconductor devices prepared using prior art contact formation methods where a via pattern and trench pattern are etched separately.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

What is claimed is:

1. A method comprising:
providing a memory array comprising a plurality of bit lines disposed below a surface of a semiconductor substrate and a plurality of word lines disposed above the surface of the substrate and transverse to the bit lines;
forming a hard mask material layer over the plurality of word lines, wherein an area above at least one of the bit lines and between two consecutive word lines is exposed below an opening in the hard mask material layer;
forming an insulating material layer above the hard mask material layer;
forming a contiguous trench and via pattern in the insulating material layer above the area such that a portion of the at least one bit line is exposed below the pattern; and
forming an interconnection comprising a conductive material disposed in the contiguous trench and via pattern wherein the interconnection is in conductive contact with the exposed portion of the at least one bit line.

2. The method according to claim 1, wherein forming the interconnection comprises depositing a conductive material in the contiguous trench and via pattern.

3. The method according to claim 2, wherein depositing the conductive material comprises chemical vapor deposition of a conductive material.

4. The method according to claim 3, wherein forming the interconnection further comprises planarizing the insulating material layer such that conductive material deposited outside of the contiguous trench and via pattern is removed.

5. The method according to claim 1, wherein the memory array comprises a non-volatile memory device wherein a charge-storage structure is disposed between the surface of the substrate and at least one of the word lines between two consecutive bit lines.

6. The method according to claim 5, wherein the charge-storage structure comprises a charge-trapping nitride layer.

7. The method according to claim 1, wherein one or more of the word lines has an upper surface and sidewalls, and wherein providing the hard mask material layer comprises forming a hard mask capping layer above the upper surface of the one or more word lines and forming hard mask spacers on the sidewalls of the one or more word lines.

8. The method according to claim 1, wherein the hard mask material layer comprises silicon nitride.

9. The method according to claim 1, wherein the hard mask material layer is formed such that an area above each of the plurality of bit lines and between two consecutive word lines is exposed below a plurality of openings in the hard mask material layer; wherein one or more contiguous trench and via patterns is formed in the insulating material layer above the areas such that a portion of each of the plurality of bit lines is exposed below the one or more patterns; and wherein one or more interconnections are formed such that each exposed portion of the plurality of bit lines is in conductive contact with at least one of the one or more interconnections.

10. The method according to claim 1, wherein forming the contiguous trench and via pattern in the insulating material layer comprises forming a photoresist pattern above the insulating material layer and removing a portion of the insulating material layer exposed below the photoresist pattern.

11. The method according to claim 1, wherein the insulating material layer comprises an interlayer dielectric layer and an intermetal dielectric layer.

12. The method according to claim 1, wherein the conductive material comprises tungsten.

13. A method comprising:
provide a memory array comprising a plurality of bit lines disposed below a surface of a semiconductor substrate and a plurality of word lines disposed above a surface of the substrate and transverse to the bit lines, wherein at least one of the bit lines is at least partially covered by a dielectric material;
forming a hard mask material layer above the plurality of word lines, wherein an area above the dielectric material and between two consecutive word lines is exposed below an opening in the hard mask material layer;
forming an insulating material layer above the hard mask material layer;
forming a contiguous trench and via pattern in the insulating material layer above the area and in the dielectric material below the area such that a portion of the at least one bit line is exposed below the pattern; and
forming an interconnection comprising a conductive material disposed in the contiguous trench and via pattern wherein the interconnection is in conductive contact with the exposed portion of the at least one bit line.

14. The method according to claim 13, wherein forming the interconnection comprises depositing a conductive material in the contiguous trench and via pattern.

15. The method according to claim 14, wherein depositing the conductive material comprises chemical vapor deposition of a conductive material.

16. The method according to claim 15, wherein forming the interconnection further comprises planarizing the insulating material layer such that conductive material deposited outside of the contiguous trench and via pattern is removed.

17. The method according to claim 13, wherein the memory array comprises a non-volatile memory device wherein a charge-storage structure is disposed between the surface of the substrate and at least one of the word lines between two consecutive bit lines.

18. The method according to claim 17, wherein the charge-storage structure comprises a charge-trapping nitride layer.

19. The method according to claim 13, wherein one or more of the word lines has an upper surface and sidewalls, and wherein providing the hard mask material layer comprises forming a hard mask capping layer above the upper surface of the one or more word lines and forming hard mask spacers on the sidewalls of the one or more word lines.

20. The method according to claim 13, wherein the hard mask material layer comprises silicon nitride.

21. The method according to claim 13, wherein each of the plurality of bit lines is at least partially covered by a dielectric material, wherein the hard mask material layer is formed such that an area above each bit line and between two consecutive word lines is exposed below a plurality of openings in the hard mask material layer; wherein one or more contiguous trench and via patterns are formed in the insulating material layer above the areas and in the dielectric material below the areas such that a portion of each of the plurality of bit lines is exposed below the one or more patterns; and wherein one or more interconnections are formed such that each exposed portion of the bit lines is in conductive contact with at least one of the one or more interconnections.

22. The method according to claim 13, wherein forming the contiguous trench and via pattern in the insulating material layer comprises forming a photoresist pattern above the insulating material layer and removing a portion of the insulating material layer exposed below the photoresist pattern.

23. The method according to claim 13, wherein the insulating material layer comprises an interlayer dielectric layer and an intermetal dielectric layer.

24. The method according to claim 13, wherein the conductive material comprises tungsten.

* * * * *